METHOD OF MANUFACTURING A ZENER DIODE

Filed June 18, 1969 3 Sheets-Sheet 1

INVENTOR.
MICHEL DE BREBISSON
BY

AGENT

INVENTOR.
MICHEL DE BREBISSON
BY

AGENT

INVENTOR.
MICHEL DE BREBISSON
BY
AGENT

United States Patent Office 3,677,838

Patented July 18, 1972

3,677,838

METHOD OF MANUFACTURING A ZENER DIODE

Michel de Brebisson, Caen, France, assignor to U.S. Philips Corporation, New York, N.Y.

Filed June 18, 1969, Ser. No. 834,403
Claims priority, application France, June 27, 1968, 156,892
Int. Cl. H01l 7/44
U.S. Cl. 148—187 5 Claims

ABSTRACT OF THE DISCLOSURE

A method of manufacturing an improved Zener diode is described. An epitaxial layer is grown on a substrate and two adjacent surface portions of the epitaxial layer are selected with the surface portions being spaced in the vicinity of the Zener diode p-n junction to be formed. Then, donor and acceptors are diffused into the surface portions in directions parallel to the surface and toward each other until the diffused fronts meet to form the desired p-n junction which extends normal to the surface.

The invention relates to a method of manufacturing a Zener diode in a semiconductor body, in which a p-n junction of the diode is formed between two zones obtained by diffusion of a donor and an acceptor impurity in substantially relatively opposite directions. The Zener diode may form part of an integrated circuit.

Semiconductor diodes are known whose current-voltage characteristic curve is linear from a threshold voltage. Such diodes are, for example, metal semiconductor diodes. These diodes permit satisfactorily detection of electric signals of low level, but they have the disadvantage that they cannot be integrated, that is to say, it is difficult to arrange them in monolithic integrated circuits.

It has been found that a Zener diode biased in the reverse direction allows linear detection of electric signals of an amplitude of a few millivolts.

Semiconductor diodes obtained by alloying, diffusion or epitaxial deposition, when biased in the reverse direction, exhibit a current-voltage characteristic curve with a linearity highly superior to that obtained with biasing in the forward direction. With an increasing voltage in the reverse direction, the linearity decreases. The current increases strongly with an increasing voltage and break-down occurs. If the diodes are formed in a crystal having a low resistivity, break-down may occur by the Zener effect proper, in which case the electric field is capable of withdrawing electrons from atoms so that the density of free charge carriers increases strongly and the resistivity considerably decreases. Zener break-down occurs only at low voltages, which are at the most equal to about 5.5 v.

If the diodes are formed in a crystal of higher resistivity, a higher break-down voltage appears. Avalanche break-down occurs due to the ionization of atoms by the collision of high velocity electrons with the atoms. Zener diodes are to be understood to mean diodes in which break-down is due to the Zener effect and/or the avalanche effect.

According, as the Zener diodes are of the category of the Zener effect proper or of the category of the avalanche effect, they exhibit differences not only in the values of their break-down voltages but also in noise and deformation properties.

When the Zener effect dominates in a Zener diode, the break-down voltage is low, the noise is weak, but the working point of the diode is located in a comparatively poorly linear part of the current-voltage characteristic curve, which gives rise to slight distortion.

When the avalanche effect dominates, the current-voltage characteristic curve has a high degree of linearity, there is no distortion but the noise is stronger. Consequently, in one case noise is weak and distortion comparatively great and in the other case there is no distortion, but the noise is comparatively strong.

In given circuit arrangements, particularly in integrated receiving circuits, it is desirable to use a Zener diode capable of operating in a voltage range of about 6 to 8 v. with a low current of the order of 100 μa., which usually gives rise to a non-negligible noise level and a comparatively great distortion due to the fact that the working point of the diode is located in the non-linear part of the current-voltage characteristic curve. These disadvantages, which are inadmissible in the case of a detection circuit, have been partly obviated by manufacturing Zener diodes having a break-down voltage of a few volts and a very low noise level by the method disclosed in applicant's copending application Ser. No. 740,943 filed June 28, 1968. This method is based on the fact that the break-down voltage of a p-n junction depends upon its structure and that an "abrupt" junction has a lower break-down voltage than a gradual junction. In order to obtain a Zener diode having a break-down voltage of a few volts and a very weak noise, it is necessary to provide a fairly abrupt junction, for example, by diffusing a donor and an acceptor impurity in relatively opposite directions to form two zones.

It has been found that there is a relationship between the area of the junction and the linearity of the current-voltage characteristic curve of a Zener diode. The linearity of the curve at a given current intensity is improved with a diminution of the junction area. It can be calculated that the maximum junction area at which the current-reverse voltage characteristic curve is still linear is about 100 μm.². However, it is difficult to manufacture suitable Zener diodes in which the junction area is smaller than a few 100 μm.².

Object of the invention is to provide a method of manufacturing a Zener diode which may be integrated in a monolithic semiconductor circuitry and which can be driven in the desired reverse voltage range with low noise and little distortion.

The invention is based inter alia on the recognition of the fact that in the manufacture of a Zener diode it is advantageous to utilize the fact that the break-down voltage of a p-n junction between two zones, at least one of which has a portion adjacent the junction with a lower resistivity than the further portions adjacent the p-n junction thereof, is determined by the portion of low resistivity, the break-down occurring near said portion.

The invention is furthermore based on the recognition that it is advantageous to use that portion of a p-n junction which is obtained by the diffusion of an impurity through part of the surface of a semiconductor body, which is transverse of said surface, whereas the portion of the junction which is substantially parallel to said surface is in fact not utilized.

According to the invention, a method of manufacturing a Zener diode in a semiconductor body, in which a p-n junction of the diode is formed between two zones obtained by diffusion of a donor and an acceptor impurity in substantially relatively opposite directions, is characterized in that the impurities are diffused into the semiconductor body through two adjacent portions of a surface of the semiconductor body, in directions substantially parallel to said surface, the p-n junction obtained between the diffused zones being substantially at right angles to said surface. The semiconductor body in which the diode is provided may be n-type or p-type conductive.

The break-down voltage and the further break-down properties of the diode are determined by the p-n junction between the two diffused, adjacent zones and are not determined by a junction between one of these zones and the adjacent part of the semiconductor body not changed by the diffusion, since the zones obtained by the diffusion have a lower resistivity than the adjacent, unchanged portion of the semiconductor body. The resultant junction between the diffused zones is an abrupt junction having a break-down voltage of the order of a few volts and the resultant diode has a very low noise level. The small surface of the resultant junction between the diffused, adjacent zones provides a satisfactory linearity, which in turn ensures minimum distortion.

The diffusion of the donor and the acceptor impurities is preferably carried out so that the diffused zones are continuous only over a small portion of their circumference while forming the p-n junction, while the connecting contacts of the diode are arranged on said zones. Thus, a p-n junction of very small surface is obtained.

An important form of the method in accordance with the invention is characterized in that the Zener diode is arranged in a monolithic integrated circuit, the semiconductor body being obtained by providing an epitaxial semiconductor layer of the conductivity type opposite that of the substrate on said substrate, insulating zones of the same conductivity type as the substrate being diffused into the epitaxial layer for dividing the latter into discrete islands in which circuit elements and the Zener diode are arranged.

A first preferred form of this embodiment is characterized in that one of the diffused zones of the diode is provided simultaneously with the insulating zones, whereas the other diffused zone of the diode is made simultaneously with the emitter zone of a transistor. The Zener diode resulting has a break-down voltage of about 5 to 6 v.

A second preferred embodiment is characterized in that one of the diffused zones of the diode is made simultaneously with the base zone of a transistor and the other diffused zone simultaneously with the emitter zone of said transistor. The resultant diode has a break-down voltage of about 6 to 8 v.

The invention furthermore relates to a Zener diode manufactured by a method in accordance with the invention.

The Zener diode according to the invention can be arranged in a simple manner in an integrated circuit because no additional diffusion operation is required.

The invention will be described more fully with reference to a few embodiments and the schematic drawing.

FIGS. 3*a* to 3*d* illustrate a number of manufacturing stages of an integrated circuit comprising a Zener diode and a transistor, in accordance with the invention.

FIGS. 4*a* to 4*d* illustrate a number of manufacturing stages of a variant of the method according to the invention to provide an integrated circuit with a Zener diode and a transistor.

It should be noted that the figures herein do not show the masking and passivating layers, usually oxide layers, which will not be described further, since the use of such layers is generally known.

In the embodiments to be described hereinafter a Zener diode according to the invention is manufactured simultaneously with an npn-type transistor, but as a matter of course the diode may be manufactured simultaneously with other kinds of active or passive circuit elements such as a diffused resistor or a pnp-type transistor.

Figure 1:
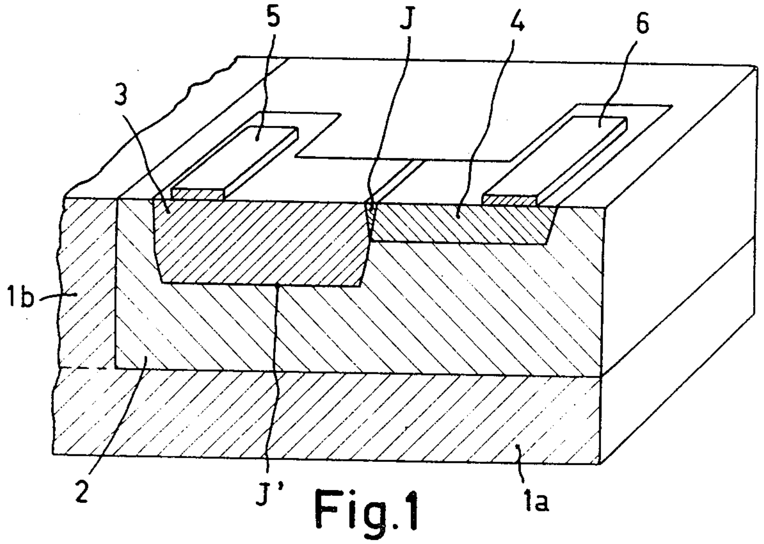
FIG. 1 is a perspective and sectional view of part of a monolithic integrated circuit comprising a Zener diode manufactured by a method in accordance with the invention.
Figure 2:
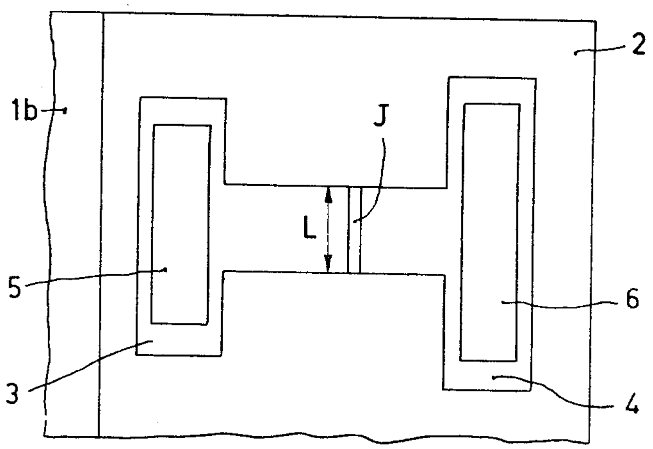
FIG. 2 is a plan view of the integrated circuit of FIG. 1.
Figure 3A:
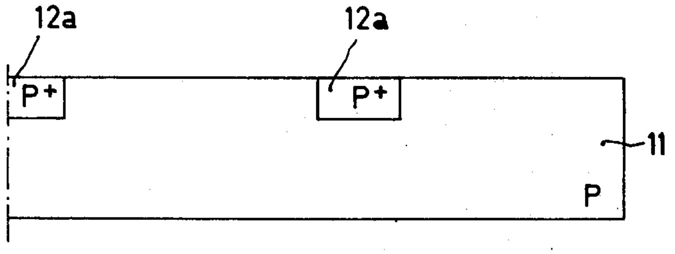
Figure 3B:
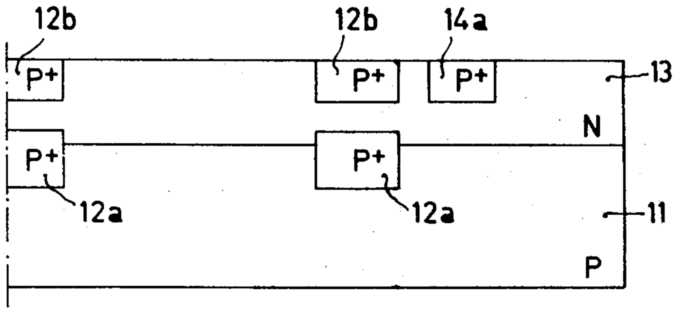
Figure 3C:
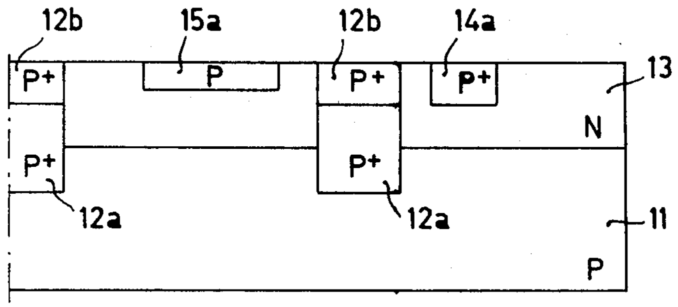
Figure 3D:
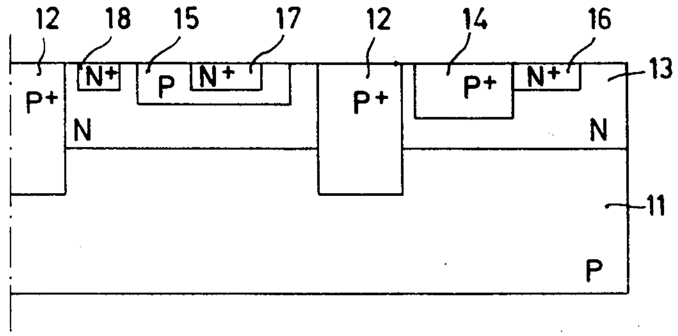
Figure 4A:
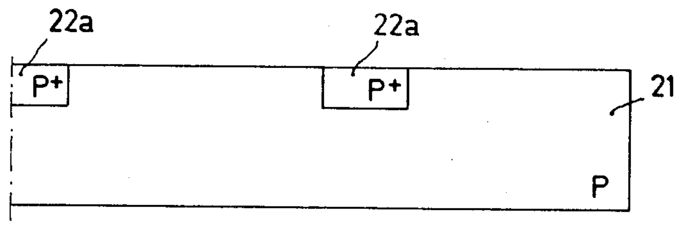
Figure 4B:
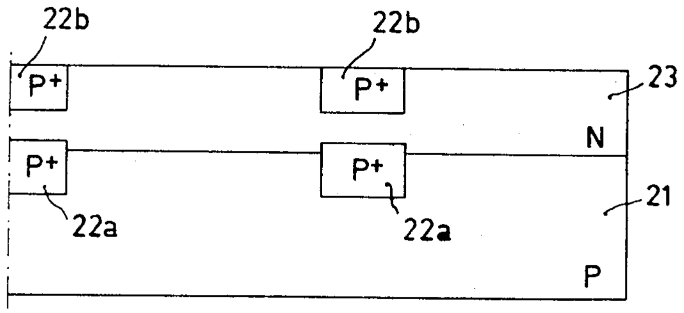
Figure 4C:
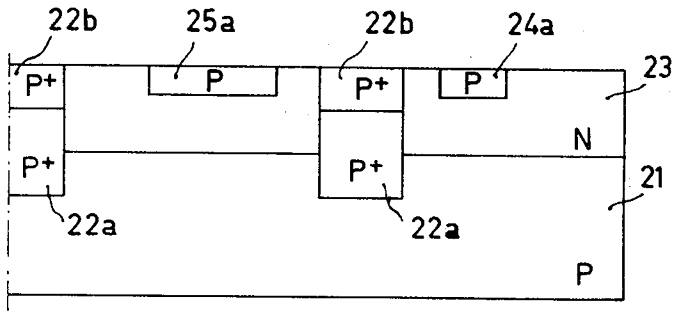
Figure 4D:
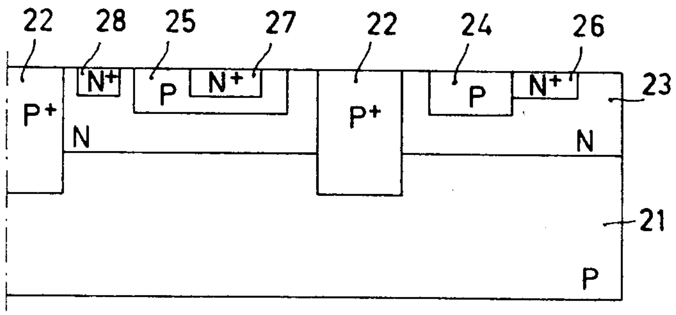

FIGS. 1 and 2 show schematically a preferred embodiment of a Zener diode according to the invention. A semiconductor substrate 1*a*, for example, of p-type conductivity supports an n-type epitaxial layer 2, in which the diode according to the invention is formed. Since this diode forms part of a monolithic, integrated semiconductor device, only the part comprising the diode is shown, the layer 2 must have an insulating zone 1*b* formed by diffusion and having the same conductivity type as the substrate 1*a*, though with a higher impurity concentration.

From the surface of the layer 2 a zone 3 is diffused via one of two surface portions, lying in the vicinity near each other, near vicinity the conductivity type of zone 3 being opposite that of the layer 2 and the impurity concentration of zone 3 matching the desired break-down voltage, and a zone 4 is diffused via the other surface portion of the two surface portions the conductivity type of this zone 4 being the same as that of the layer 2, the impurity concentration being, however, higher.

During the thermal treatments a lateral diffusion of the impurities for the zones 3 and 4 is performed or, in other words, the diffusion is performed in directions substantially parallel to the surface of the epitaxial layer 2 so that the impurities approach each other. The p-n junction J is thus formed between the diffused zones 3 and 4. The junction J is substantially normal to the surface of the epitaxial layer 2 and is an abrupt junction. Simultaneously with the junction J the p-n junction J' is formed between the layer 2 and the zone 3. This junction J' has a higher break-down voltage than the junction J, because the resistivity of the layer 2 is higher than that of the zones 3 and 4.

In order to obtain small dimensions of said junction J and yet a large surface for depositing the contacts 5 and 6 on the zones 3 and 4, T-shaped zones 3 and 4 are made, which are adjacent each other over only a small portion of their circumference to form the junction J, as is indicated in FIGS. 1 and 2.

The width L of the adjacent portions of the zones 3 and 4 may be smaller than 10$\mu$ so that the surface of the junction J may be only a few tens of square microns.

FIGS. 3*a* to 3*d* illustrate the consecutive stages of the manufacture of part of an integrated monolithic structure comprising at least one Zener diode according to the invention and a transistor.

In a p-type silicon substrate 11 the p+-type zones 12*a* are provided to obtain insulating zones in a subsequent manufacturing stage.

The substrate 11 is provided with an epitaxial n-type silicon layer 13. Into this layer 13 are diffused the p+-type surface zones 12*b* also for obtaining the insulating zones and furthermore the p+-type zone 14*a* for obtaining the Zener diode. Then, the p-type zone 15*a* is diffused for obtaining the base zone of an npn-type transistor. Subsequently, the n+-type emitter zone 17, the n+-type zone 16 of the diode and the n+-type contact zone 18 are provided by diffusion.

After the last diffusion step the zones 12*a* and 12*b* have formed the insulating zones 12 and the zones 14*a* and 15*a* have formed the zones 14 and 15.

The diode zones 14 and 16 and the emitter zone 17, the base zone 15 and the contact zone 18 of the collector of the npn-type transistor may be provided in a conventional manner with connecting contacts.

Since the diode zone 14 is made simultaneously with the insulating zones 12 and the diode zone 16 is made simultaneously with the emitter zone 17, no separate diffusion step is required for making the diode.

The integrated semiconductor device may comprise more and other circuit elements than those shown and the circuit elements may be interconnected in a conventional manner.

The p-type diode zone may be provided simultaneously with the base zone of an npn-type transistor. This will be described with reference to FIGS. 4*a* to 4*d*.

In order to obtain the insulating zones 22 the p+-type surface zones 22*a* are diffused into the p-type substrate 21. This substrate is provided with an n-type epitaxial layer 23, which is provided with the diffused surface zone 22*b* in order to obtain also the insulating zones 22. Subsequently, the p-type base zone 25*a*, 25, the $n^+$-type emitter zone 27 and the $n^+$-type collector contact zone 28 are provided by diffusion.

Simultaneously with the p-type 25*a* for obtaining the base zone 25, the p-type zone 24*a* is provided for obtaining the p-type zone 24 of the Zener diode. The $n^+$-type zone 26 of the Zener diode is provided simultaneously with the emitter zone 27 of the transistor.

It should be noted that the diffusion treatments are not described in detail, since such treatments are generally known.

The provision of a Zener diode according to the invention in an integrated semiconductor device does not bring about an increase in manufacturing steps and even permits attaining higher voltage ranges for the diode.

It will be obvious that within the scope of the invention many variants of the embodiments described are possible.

What is claimed is:

1. A method of manufacturing an integrated semiconductor device comprising at least one Zener diode, comprising the steps of providing a semiconductor substrate having a surface part, defining two adjacent surface portions of the substrate, said surface portions being spaced apart in the vicinity of a p-n junction to be formed, and diffusing donor and acceptor impurities into the surface portions in directions substantially parallel to the surface of the substrate and towards each other until they meet to form a p-n junction substantially normal to said surface.

2. A method as set forth in claim 1, wherein said substrate surface part comprises an epitaxial layer of opposite conductivity type to the other part of the substrate.

3. A method as set forth in claim 2, further comprising the step of diffusing insulating zones into said epitaxial layer of the same conductivity type as said substrate to form discrete islands in which circuit elements are arranged.

4. A method as set forth in claim 3, wherein the diffusing into one of said surface portions is done simultaneously with the diffusing of said insulating zones and the diffusing into the other of said surface portions is done simultaneously with the diffusing of the emitter of a transistor.

5. A method as set forth in claim 1, wherein the diffusing into one of said surface portions is done simultaneously with the diffusing of the base zone of a transistor and the diffusing into the other of said surface portions is done simultaneously with the emitter of the transistor.

References Cited

UNITED STATES PATENTS

| | | | |
|---|---|---|---|
| 3,338,758 | 8/1967 | Tremere | 148—186 X |
| 3,414,782 | 12/1968 | Lin et al. | 317—235 |
| 3,430,110 | 2/1969 | Goshgarian | 148—175 |
| 3,441,815 | 4/1969 | Pollock et al. | 317—235 |
| 3,445,793 | 5/1969 | Biard | 317—235 |

L. DEWAYNE RUTLEDGE, Primary Examiner

J. M. DAVIS, Assistant Examiner

U.S. Cl. X.R.

29—576; 148—175; 317—234 R, 235 T

PO-1050
(5/69)

UNITED STATES PATENT OFFICE
CERTIFICATE OF CORRECTION

Patent No. 3,677,838 Dated July 18, 1972

Inventor(s) MICHEL DE BREBISSON

It is certified that error appears in the above-identified patent and that said Letters Patent are hereby corrected as shown below:

Cancel Claim 1 and insert the following:

-- 1. A method of manufacturing an integrated semiconductor device comprising at least one Zener diode, comprising the steps of providing a semiconductor substrate having a surface part, defining two adjacent portions on the same surface of the substrate, said surface portions being spaced apart in the vicinity of a p-n junction to be formed, and diffusing donor and acceptor impurities into the substrate surface portions in directions substantially parallel to said surface of the substrate and toward each other until they meet and overlap to form a p-n junction part extending substantially normal to said surface, said p-n junction part at the surface of the substrate containing diffused donor and acceptor impurity concentrations which are greater than the bulk impurity concentration of the substrate and determining the break-down voltage of said p-n junction to serve as the Zener diode.--

Signed and sealed this 2nd day of January 1973.

(SEAL)
Attest:

EDWARD M.FLETCHER,JR.
Attesting Officer

ROBERT GOTTSCHALK
Commissioner of Patents